United States Patent
Minami

(10) Patent No.: US 9,374,032 B2
(45) Date of Patent: Jun. 21, 2016

(54) PWM OUTPUT APPARATUS AND MOTOR DRIVING APPARATUS

(71) Applicant: Renesas Electronics Corporation, Kawasaki-shi, Kanagawa (JP)

(72) Inventor: Masahiro Minami, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/463,847

(22) Filed: Aug. 20, 2014

(65) Prior Publication Data
US 2014/0354207 A1 Dec. 4, 2014

Related U.S. Application Data

(62) Division of application No. 13/645,619, filed on Oct. 5, 2012, now Pat. No. 8,816,621.

(30) Foreign Application Priority Data

Oct. 5, 2011 (JP) .................................. 2011-220655

(51) Int. Cl.
*H02P 6/04* (2006.01)
*H02P 23/00* (2016.01)
(Continued)

(52) U.S. Cl.
CPC ............... *H02P 23/00* (2013.01); *H02P 27/08* (2013.01); *H03K 7/08* (2013.01)

(58) Field of Classification Search
CPC . H02P 27/08; H02P 2207/05; H02P 2101/45; H02P 21/0032; H02P 21/14; H02P 2201/09; H02P 23/0027; H02P 23/0077; H02P 3/18; H02P 6/085; H02P 6/24; H02P 21/146; H02P 2203/03; H02P 2203/11

USPC ................. 318/400.11, 400.27, 400.33, 503; 332/109
See application file for complete search history.

(56) References Cited

U.S. PATENT DOCUMENTS

| | | | | |
|---|---|---|---|---|
| 5,600,559 A | * | 2/1997 | Nishimoto | B62D 5/0466 180/404 |
| 5,721,475 A | * | 2/1998 | Fincher | G05B 11/28 318/400.17 |
| 5,764,024 A | * | 6/1998 | Wilson | H02M 7/53873 318/400.11 |

(Continued)

OTHER PUBLICATIONS

"MC9S12E128, MC9S12E64, MC9S12E32 Data Sheet", (Especially p. 325) [online] Oct. 2005, Free Scale company, [Search on Jun. 23, 2011], Internet URL <http://cache.freescale.com/files/microcontrollers/doc/data_sheet/MC9S12E128V1.pdf>.

*Primary Examiner* — Paul Ip
(74) *Attorney, Agent, or Firm* — Shapiro, Gabor and Rosenberger, PLLC

(57) ABSTRACT

A PWM output apparatus includes a calculating circuit configured to calculate an output width of a PWM output signal of a first signal and a second signal, which have phases different from each other, based on a command value of a PWM output. A comparing circuit compares the output width and a reference period which is set longer than a predetermined dead time period. A PWM output signal generating circuit outputs the PWM output signal to a dead time inserting block as a corrected PWM output signal, when a set/clear signal generating circuit outputs the set signal, and carries out a correction of setting the first signal of the PWM output signal to be inactive to output to the dead time inserting block as the corrected PWM output signal, when the set/clear circuit outputs the clear signal. The dead time inserting block corrects the corrected PWM output signal.

8 Claims, 10 Drawing Sheets

(51) Int. Cl.
*H02P 27/08* (2006.01)
*H03K 7/08* (2006.01)

(56) References Cited

U.S. PATENT DOCUMENTS

| | | | | |
|---|---|---|---|---|
| 5,825,141 | A * | 10/1998 | Matsui | H02P 23/0077 318/400.13 |
| 6,246,208 | B1 * | 6/2001 | Gatti | B60L 11/1803 318/619 |
| 6,348,775 | B1 * | 2/2002 | Edelson | H02K 3/28 318/599 |
| 6,535,402 | B1 * | 3/2003 | Ying | H02M 7/5387 363/134 |
| 6,661,364 | B2 * | 12/2003 | Kohara | G06F 1/025 341/155 |
| 7,016,207 | B2 * | 3/2006 | Yamanaka | H02M 7/487 363/132 |
| 7,057,910 | B2 * | 6/2006 | Takahashi | H02M 1/38 323/283 |
| 7,782,037 | B2 * | 8/2010 | Ohtani | H02M 1/38 323/271 |
| 7,804,379 | B2 * | 9/2010 | Kris | H02M 1/38 332/109 |
| 7,944,720 | B2 | 5/2011 | Suzuki et al. | |
| 7,969,129 | B2 | 6/2011 | Kudo | |
| 8,076,880 | B2 * | 12/2011 | Hiramine | H02P 21/0032 318/400.02 |
| 8,089,232 | B2 | 1/2012 | Itagaki et al. | |
| 8,115,563 | B2 * | 2/2012 | Odagiri | H03F 3/217 327/131 |
| 8,117,482 | B2 * | 2/2012 | Takata | G06F 1/025 713/500 |
| 8,120,345 | B2 | 2/2012 | Akiyama et al. | |
| 8,125,206 | B2 | 2/2012 | Akiyama et al. | |
| 8,139,385 | B2 | 3/2012 | Furuchi | |
| 8,193,743 | B2 * | 6/2012 | Yamada | H02M 7/53875 318/162 |
| 8,207,558 | B2 | 6/2012 | Shiraishi et al. | |
| 8,222,875 | B2 | 7/2012 | Kudo | |
| 8,278,854 | B2 * | 10/2012 | Imura | B60L 11/1803 318/400.02 |
| 8,305,017 | B2 * | 11/2012 | Fukushima | H02P 3/18 318/362 |
| 8,519,687 | B2 | 8/2013 | Kudo | |
| 8,680,830 | B2 | 3/2014 | Kudo | |
| 2003/0128146 | A1 * | 7/2003 | Kohara | G06F 1/025 341/155 |
| 2004/0129957 | A1 * | 7/2004 | Takahashi | H02M 1/38 257/232 |
| 2004/0174723 | A1 * | 9/2004 | Yamanaka | H02M 7/487 363/37 |
| 2005/0025231 | A1 * | 2/2005 | Mitsuki | H02M 7/5395 375/238 |
| 2006/0189011 | A1 * | 8/2006 | Takahashi | H02M 1/38 438/14 |
| 2007/0030705 | A1 * | 2/2007 | Yamamoto | H02M 7/53873 363/41 |
| 2007/0040871 | A1 * | 2/2007 | Urano | B41J 11/42 347/68 |
| 2007/0053670 | A1 * | 3/2007 | Iwanaga | H02P 25/028 388/811 |
| 2008/0315851 | A1 | 12/2008 | Akiyama et al. | |
| 2009/0001925 | A1 * | 1/2009 | Ohtani | H02M 1/38 318/805 |
| 2009/0051346 | A1 * | 2/2009 | Manabe | B60L 11/1887 323/363 |
| 2009/0128202 | A1 * | 5/2009 | Takata | G06F 1/025 327/151 |
| 2009/0256509 | A1 * | 10/2009 | Hiramine | H02P 21/0032 318/400.13 |
| 2009/0278621 | A1 * | 11/2009 | Kris | H02M 1/38 332/109 |
| 2010/0134053 | A1 * | 6/2010 | Yamada | H02M 7/53875 318/162 |
| 2010/0171452 | A1 * | 7/2010 | Fukushima | H02P 6/24 318/400.11 |
| 2010/0259204 | A1 * | 10/2010 | Imura | B60L 11/1803 318/400.02 |
| 2010/0321570 | A1 * | 12/2010 | Odagiri | H03F 3/217 348/500 |
| 2011/0181255 | A1 | 7/2011 | Hashimoto et al. | |
| 2011/0182096 | A1 | 7/2011 | Suzuki et al. | |
| 2011/0204858 | A1 | 8/2011 | Kudo | |
| 2011/0273914 | A1 * | 11/2011 | Kim | H02M 7/5387 363/41 |
| 2012/0086416 | A1 | 4/2012 | Kudo et al. | |
| 2012/0105155 | A1 * | 5/2012 | Odagiri | H03F 3/217 330/207 A |
| 2012/0126735 | A1 * | 5/2012 | Ueda | H02M 1/38 318/400.27 |
| 2012/0189139 | A1 | 7/2012 | Ohara et al. | |
| 2012/0206077 | A1 * | 8/2012 | Yoneshima | H02P 6/185 318/400.33 |
| 2012/0212196 | A1 * | 8/2012 | Ozasa | G03G 15/80 323/271 |
| 2013/0009585 | A1 * | 1/2013 | Hashimoto | H02P 27/045 318/503 |

* cited by examiner

PWM OUTPUT APPARATUS AND MOTOR DRIVING APPARATUS

CROSS REFERENCE

This application claims a priority on convention based on Japanese Patent Application No. JP 2011-220655. The disclosure thereof is incorporated herein by reference.

TECHNICAL FIELD

The present invention is related to a semiconductor integrated circuit, and especially, to a PWM (Pulse Width Modulation) output apparatus for motor control, and a motor driving apparatus using the same.

BACKGROUND ART

In recent years, measures to environmental issues are requested worldwide. Especially, an energy saving request has become severe to home electronics products such as a washing machine and an air conditioner. A microcomputer installed with a PWM output apparatus is widely used to control a 3-phase motor installed in each of the home electronics products.

Generally, the outputs of the 3 phases of U phase, V phase, and W phase are used to control the 3-phase motor. The PWM output apparatus outputs PWM control signals of a positive phase and a negative phase for each phase to control the 3-phase motor. In order to rotate the 3-phase motor precisely, the ON/OFF period of each of the PWM output signals of the positive phase and the negative phase used to control the 3-phase motor must be adjusted finely. However, it is very difficult to carry out the precise adjustment due to a wiring delay to the motor and temperature variability. Therefore, it is desired that the realization of the PWM output apparatus possible to control in well precision and finely.

A positive phase PWM output signal and a negative phase PWM output signal are complementary to each other, and basically, when one of them is in an ON condition, the other is in an OFF condition. However, there is a possibility that the positive phase PWM output signal and the negative phase PWM output signal are turned on simultaneously due to a wiring delay from the microcomputer to the motor unit and temperature characteristics. When the positive phase PWM output signal and the negative phase PWM output signal are turned on simultaneously, a short-circuit current flows through a motor control circuit. It is desired to avoid such a phenomenon in order to guarantee a normal operation of the motor unit.

A method of setting a dead time is known to prevent that the positive phase PWM output signal and the negative phase PWM output signal are turned on simultaneously. The dead time is a period which is set for the motor control to prevent that the positive phase PWM output signal and the negative phase PWM output signal are turned on simultaneously. During this period, the positive phase PWM output signal and the negative phase PWM output signal are both set to an inactive condition. The setting of the dead time is called a dead time insertion.

A technical example in which the dead time is inserted is disclosed in Non-Patent Literature 1. A microcomputer in Non-Patent Literature 1 is provided with a PWM output signal block and a dead time inserting block. This example has a purpose of controlling the 3-phase motor by adjusting the PWM output width in units of clock cycles, while avoiding that the positive phase PWM output signal and the negative phase PWM output signal are turned on simultaneously.

FIG. 1A and FIG. 1B are block diagrams showing a circuit configuration of a saw-teeth waveform (triangular waveform) PWM output apparatus of Non-Patent Literature 1. This circuit is provided with a PWM generator 300, a PWM output width setting register 301, a PWM output signal 302 outputted from the PWM generator 300, a dead time inserting block 303, a dead time setting register 304, and a PWM output signal 305 after the dead time insertion. The PWM output signal 302 has six signal lines. The signals of the positive phase and the negative phase of each of the U phase, the V phase, and the W phase of the 3-phase motor are transmitted by these signal lines.

The dead time inserting block 303 inserts a dead time into the PWM output signal. Specifically, after a negative phase PWM output signal is set to the inactive condition, a positive phase PWM output signal is set to an inactive condition for a dead time period. Moreover, after the positive phase PWM output signal is set to the inactive condition, the negative phase PWM output signal is set to the inactive condition for the set dead time period. By such an operation, even when a difference occurs between the positive phase and negative phase PWM output signals, it can be avoided that the positive phase and negative phase PWM output signals become active simultaneously.

An example of the PWM output signal 302 outputted from the PWM generator 300 of the above PWM output apparatus is shown in FIG. 2A and FIG. 2B. The PWM output width of 4 clock cycles is set to the PWM output width setting register 301 and the dead time of 2 clock cycles is set to the dead time setting register 304.

The positive phase and negative phase PWM output signals of the PWM output signal 302 before the dead time insertion are respectively shown as the PWM output signal (positive phase) 401 and the PWM output signal (negative phase) 402. In this condition, a simultaneous ON condition does not occur. However, in an actual device, due to influence of a wiring capacity and so on, a delay sometimes occurs in a rising edge and/or falling edge of each of the positive phase and negative phase PWM output signals. In order to avoid the simultaneous ON condition even in such a case, the dead time is inserted.

When a delay occurs at the switching of the PWM output signal (negative phase) 402 from a high level to a low level, the dead time is inserted into the PWM output signal (positive phase) 401. The PWM output signal (positive phase) 403 shows a waveform after the dead time period 405 of 2 clock cycles is inserted. The timing when the PWM output signal (positive phase) 403 is switched from the low level to the high level is delayed by the 2 clock cycles, compared with the PWM output signal (positive phase) 401 outputted from the PWM generator 300.

In the same way, when a delay occurs at the switching of the PWM output signal 401 (positive phase) from the high level to the low level, the dead time is inserted in the PWM output signal (negative phase) 402. The PWM output signal (negative phase) 404 shows a waveform after the dead time period 406 of the 2 clock cycles is inserted. The PWM output signal (negative phase) 404 is delayed by the 2 clock cycles in the switching timing from the low level to the high level, compared with the PWM output signal (negative phase) 402 outputted from the PWM generator 300.

In the above-mentioned related technique, the simultaneous ON condition of the positive phase PWM signal and the negative phase PWM signal can be prevented by inserting a constant dead time period at the rising edge or falling edge of the PWM output signal.

CITATION LIST

Non-Patent Literature 1

"MC9S12E128, MC9S12E64, MC9S12E32 Data Sheet", (Especially page 325)
[online] October, 2005, Free Scale company,
[Search on Jun. 23, 2011], Internet URL
<http://cache.freescale.com/files/microcontrollers/doc/data_sheet/MC9S12E128V1.pdf>

SUMMARY OF THE INVENTION

In the above-mentioned related technique, the PWM output signal 302 from the PWM generator 300 is supplied to the dead time inserting block 303 regardless of a dead time setting width. Therefore, the dead time inserting operation is carried out even when the PWM output width which is shorter than the dead time period is set. As a result, there is a problem that the PWM output signal can not adjusted from the active or inactive condition sequentially in units of clock cycles so that the motor can not be precisely controlled.

This problem will be described in detail with reference to FIG. 3A to FIG. 3F. FIG. 3A to FIG. 3F show waveforms outputted from the PWM output apparatus in the related technique. The dead time period of 2 clock cycles is set to the dead time setting register 304. FIG. 3A to FIG. 3F show waveforms when six kinds of PWM output widths of 0 clock cycle, 1 clock cycle, 2 clock cycles, 3 clock cycles, 4 clock cycles, and 5 clock cycles are set to the PWM output width setting register 301, respectively. The PWM output signal before the dead time insertion and the PWM output signal after the dead time insertion are arranged up and down in each drawing. The PWM output signal after the dead time insertion is outputted from the PWM output apparatus in the related technique and shows the PWM output signal used for the motor control.

FIG. 3A shows the PWM output signal when the PWM output width of 0 clock cycle is set to the PWM output width setting register 301. In this case, in the PWM output signal 302 before the dead time insertion, the positive phase is fixed to the inactive condition and a negative phase is fixed to the active condition. Any event (switching from the active condition into the inactive condition) that the dead time is inserted does not occur in both of the positive phase and the negative phase. Therefore, the positive phase is fixed to the inactive condition in the PWM output signal 305 after the dead time insertion, and the negative phase is also fixed to the active condition.

FIG. 3B shows the PWM output signal when the PWM output width of 1 clock cycle is set to the PWM output width setting register 301. In the PWM output signal 302 before the dead time insertion, the positive phase is set to the active condition during 1 clock cycle and the negative phase is set to the inactive condition during 1 clock cycle. In the PWM output signal 305 after the dead time insertion, the positive phase is fixed to the inactive condition and the negative phase is set to the inactive condition during 3 clock cycle.

FIG. 3C shows the PWM output signal when the PWM output width of the 2 clock cycles is set to the PWM output width setting register 301. In the PWM output signal 302 before the dead time insertion, the positive phase is set to the active condition during 2 clock cycles and the negative phase is set to the inactive condition during 2 clock cycle. In the PWM output signal 305 after the dead time insertion, the positive phase is fixed to the inactive condition, and the negative phase is set to the inactive condition during 4 clock cycles.

FIG. 3D shows the PWM output signal when the PWM output width of the 3 clock cycles is set to the PWM output width setting register 301. In the PWM output signal 302 before the dead time insertion, the positive phase is set to the active condition during the 3 clock cycles and the negative phase is set to the inactive condition during 3 clock cycles. In the PWM output signal 305 after the dead time insertion, the positive phase is set to the active condition during 1 clock cycle, and the negative phase is set to the inactive condition during the 5 clock cycles.

FIG. 3E shows the PWM output signal when the PWM output width of the 4 clock cycles is set to the PWM output width setting register 301. In the PWM output signal 302 before the dead time insertion, the positive phase is set to the active condition during 4 clock cycles and the negative phase is set to the inactive condition during 4 clock cycles. In the PWM output signal 305 after the dead time insertion, the positive phase is set to the active condition during 2 clock cycles, and the negative phase is set to the inactive condition during 6 clock cycles.

FIG. 3F shows the PWM output signal when the PWM output width of the 5 clock cycle is set to the PWM output width setting register 301. In the PWM output signal 302 before the dead time insertion, the positive phase is set to the active condition during 5 clock cycles and the negative phase is set to the inactive condition during 5 clock cycle. In the PWM output signal 305 after the dead time insertion, the positive phase is set to the active condition during the 3 clock cycles, and the negative phase is set to the inactive condition during 7 clock cycles.

When FIG. 3A and FIG. 3B are compared, the PWM output signal (negative phase) after the dead time insertion is switched suddenly from the active condition (FIG. 3A) to the inactive condition (FIG. 3B) during 3 clock cycles. In order to rotate the motor precisely, it is desirable that the condition of the PWM output signal is switched sequentially in the 1 clock cycle width as in from a fixation condition to the active condition→the inactive condition during 1 clock cycle→the inactive condition during 2 clock cycles→the inactive condition during 3 clock cycles. However, in the related technique, the above-mentioned adjustment is not attained. That is, in the related technique, the PWM output width can not be controlled sequentially in units of clock cycle widths from the fixation to the active condition (FIG. 3A).

The PWM output apparatus of the present invention is provided with a calculating circuit configured to calculate an output width of a PWM output signal of a first signal and a second signal, which have phases different from each other, based on a command value of a PWM output; a comparing circuit configured to compare the output width and a reference period which is set longer than a predetermined dead time period; a set/clear signal generating circuit configured to output a clear signal when the output width is shorter than the reference period, and output a set signal when the output width is longer than the reference period; a PWM output signal generating circuit configured to output the PWM output signal to a dead time inserting block as a corrected PWM output signal, when the set/clear signal generating circuit outputs the set signal, and carry out a correction of setting the first signal of the PWM output signal to be inactive to output to the dead time inserting block as the corrected PWM output signal, when the set/clear circuit outputs the clear signal; and the dead time inserting block configured to correct the corrected PWM output signal such that the second signal is inactivated during the dead time period after the first signal is changed from an active state to an inactive state, to output as a corrected command value.

In the related technique, when the pulse width of the negative phase signal is small, the pulse width of the negative phase signal after the dead time insertion changes over a period between the width of 0 and the dead time period. On the other hand, in the present invention, when the pulse width is small, any dead time is not inserted in a second signal (e.g. negative phase signal) in the dead time period after the first signal (e.g. positive phase signal) is set to the active condition. When the pulse width exceeds a predetermined value, the pulse width of the second signal starts to increase smoothly. As a result, the precise and smooth control can be carried out even when the pulse width is small.

According to the PWM output apparatus of the present invention, the PWM output width can be correctly controlled in a small unit.

DESCRIPTION OF EMBODIMENTS

Hereinafter, embodiments of the present invention will be described with reference to the attached drawings. The PWM output apparatus for motor control according to a first embodiment of the present invention is provided with a dead time inserting block, a calculating circuit, a comparing circuit and a PWM signal generating circuit. The dead time inserting block sets a dead time period to the positive phase signal and the negative phase signal of the PWM output signal in order to prevent that the positive phase signal and the negative phase signal of the PWM output signal from being turned on simultaneously. The calculating circuit calculates a PWM output width before dead time insertion. The comparing circuit compares the calculated PWM output width and a predetermined dead time period. The PWM generating circuit outputs the PWM output signal before the dead time insertion to the dead time inserting block based on the comparison result of the comparing circuit.

When it is determined in the comparing circuit that the PWM output width before the dead time insertion which has been calculated by the calculating circuit is shorter than a predetermined dead time period, the PWM output signal outputted from the PWM signal generating circuit to the dead time inserting block is set to an inactive condition. When the PWM output width before the dead time insertion is equal to or longer than the predetermined dead time period, the PWM output signal having the PWM output width before the dead time insertion which has been calculated by the calculating circuit is outputted just as it is. Through such an operation, the PWM output signal is fixed to the inactive condition, until the PWM output width before the dead time insertion becomes longer than the predetermined dead time period. The dead time is inserted after the PWM output width becomes longer than the predetermined dead time period. As a result, the PWM output signal which is outputted sequentially from the PWM output apparatus becomes able to be controlled in a one clock cycle width.

Figure 1A:
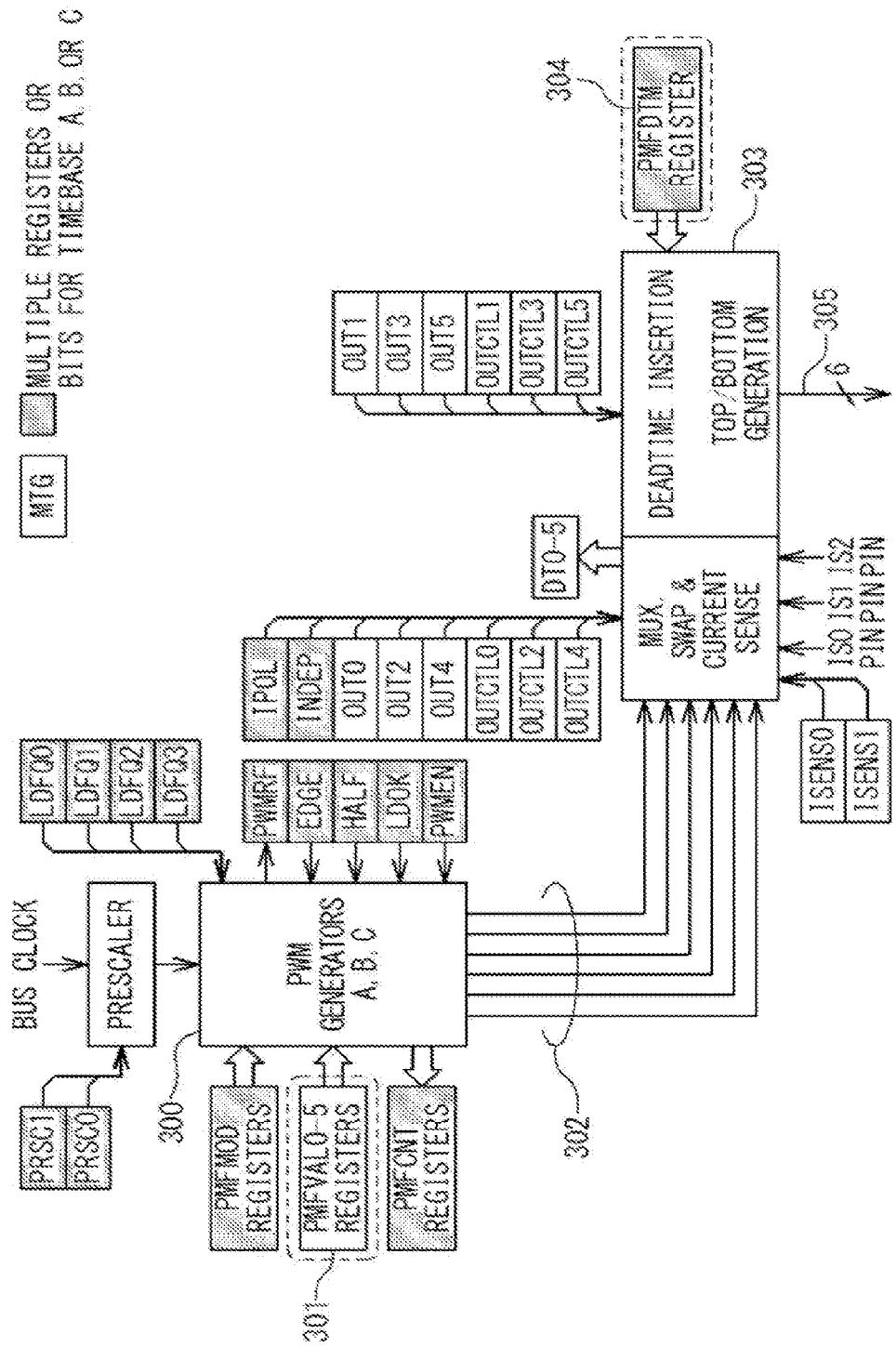
FIG. 1A is a circuit diagram of a saw-teeth waveform PWM output apparatus in a conventional technique.
Figure 1B:
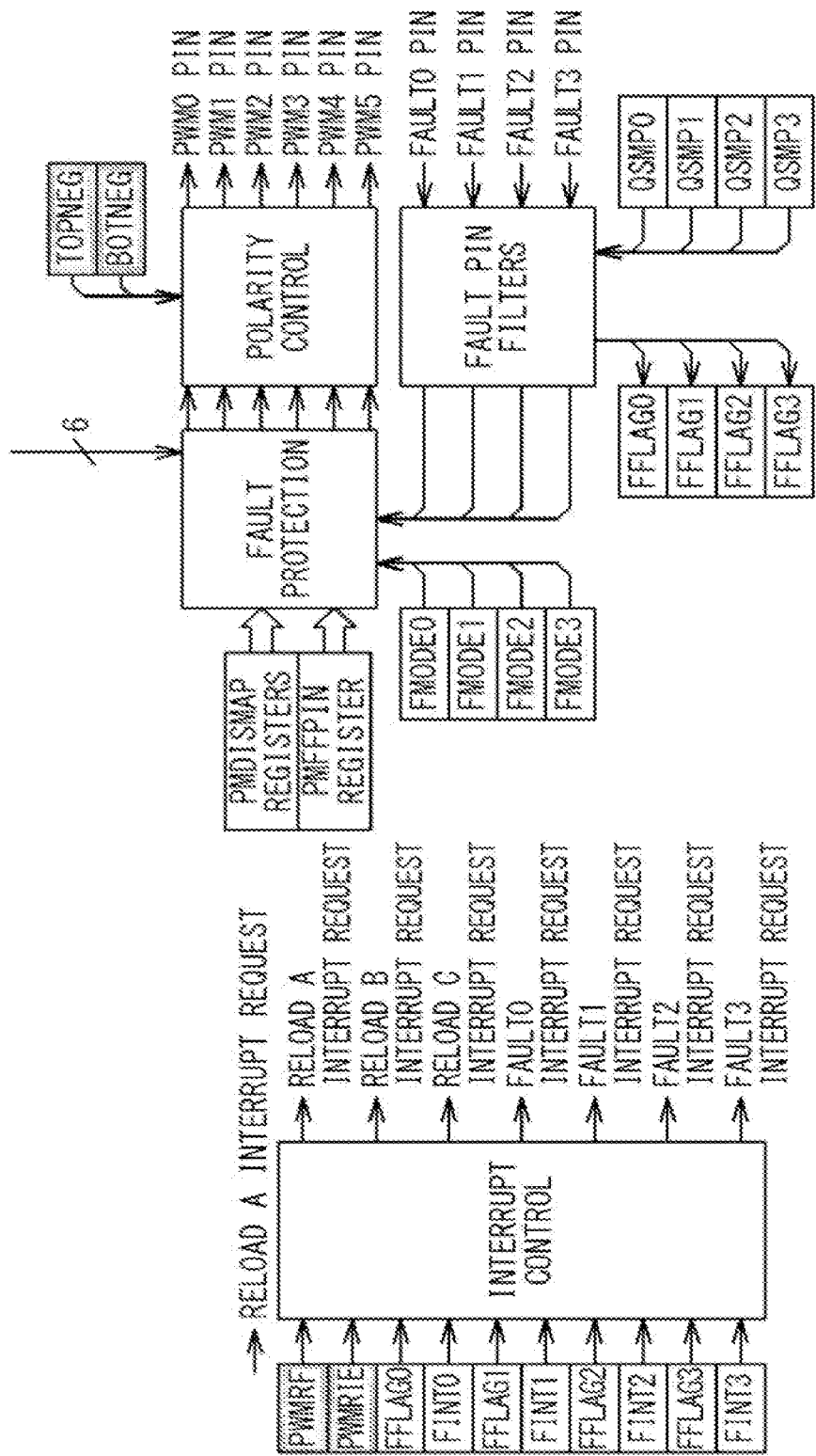
FIG. 1B is a circuit diagram of the saw-teeth waveform PWM output apparatus in the conventional technique.
Figure 2A:
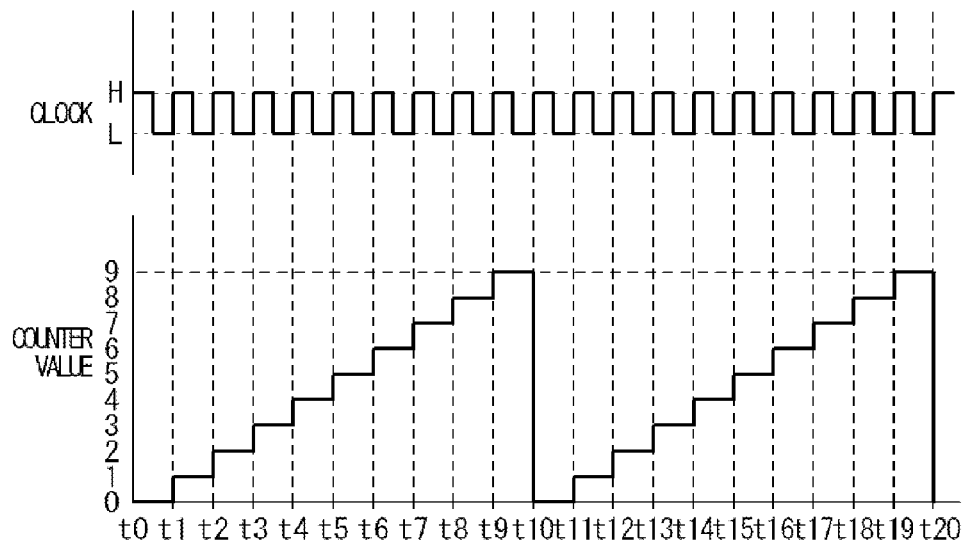
FIG. 2A shows a clock signal and a counter value in the saw-teeth waveform PWM output apparatus in the conventional technique.
Figure 2B:
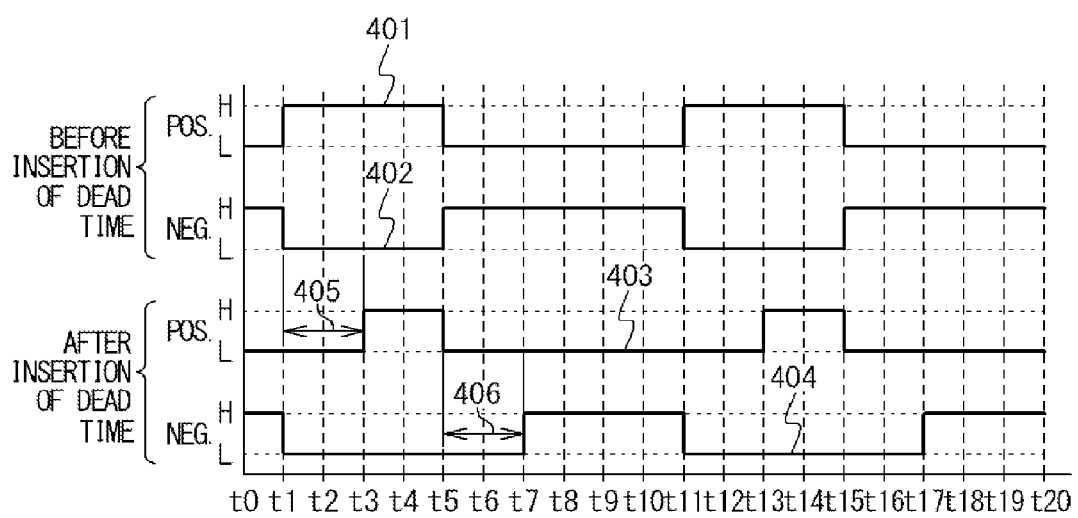
FIG. 2B shows a PWM output signal at the dead time insertion in the saw-teeth waveform PWM output apparatus in the conventional technique.
Figure 3A:
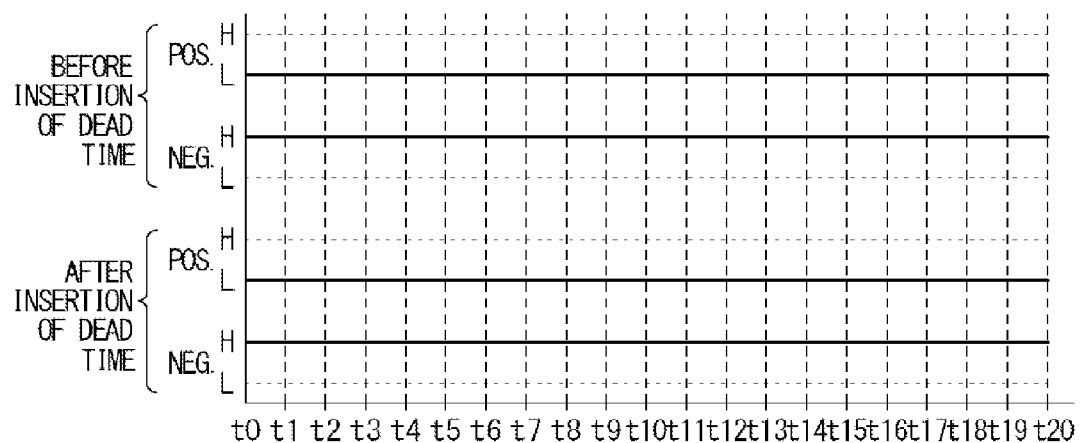
FIG. 3A shows the PWM output signal of the saw-teeth waveform PWM output apparatus in the related technique.
Figure 3B:
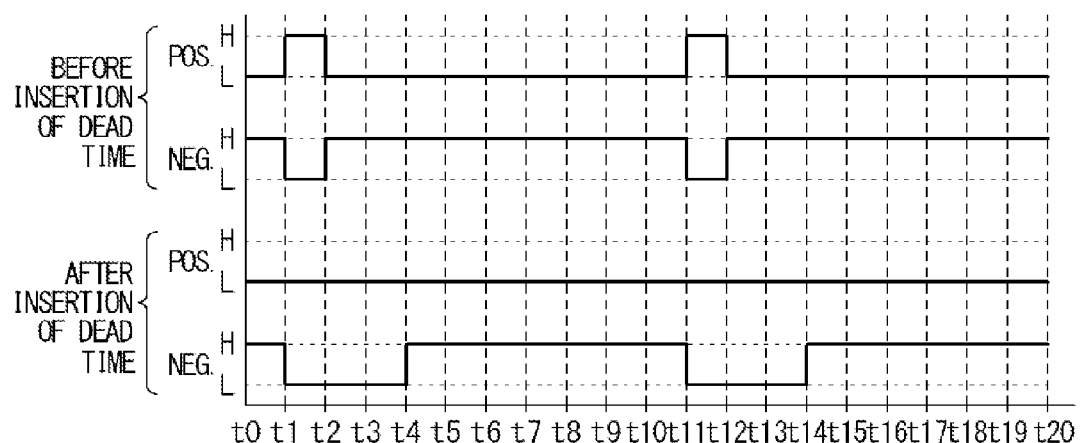
FIG. 3B shows the PWM output signal of the saw-teeth waveform PWM output apparatus in the related technique.
Figure 3C:
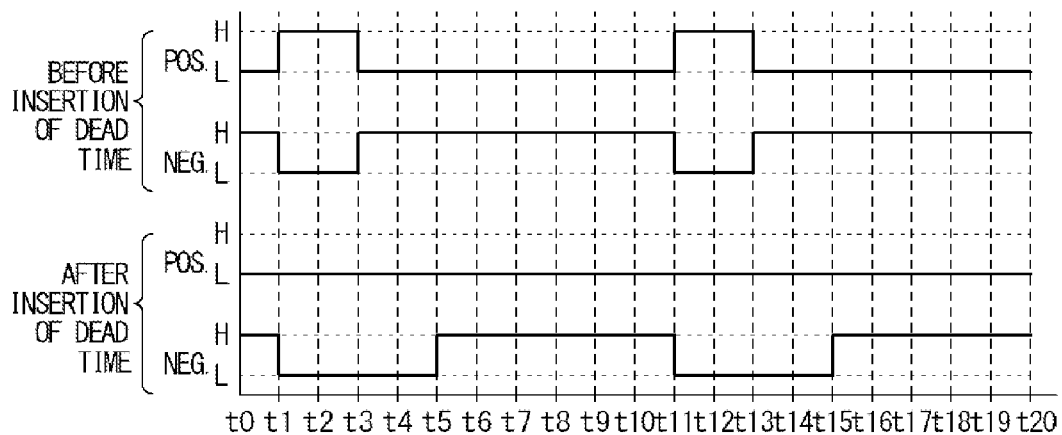
FIG. 3C shows the PWM output signal of the saw-teeth waveform PWM output apparatus in the related technique.
Figure 3D:
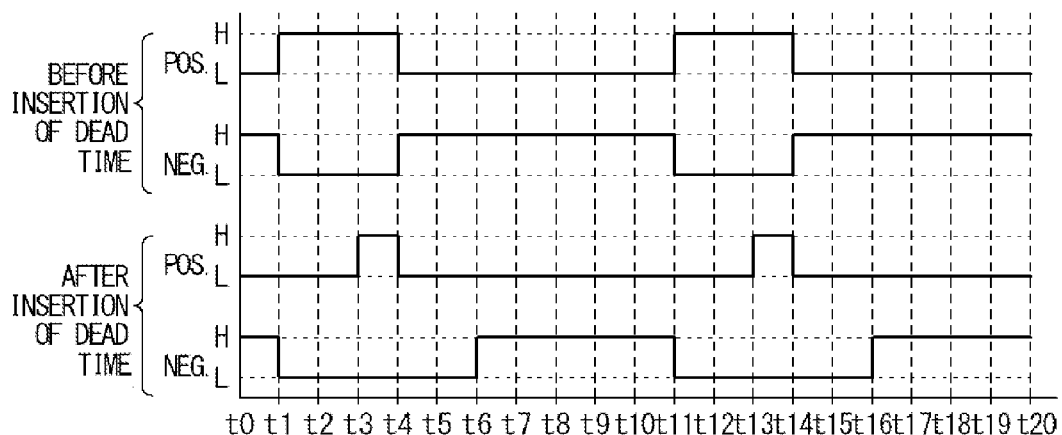
FIG. 3D shows the PWM output signal of the saw-teeth waveform PWM output apparatus in the related technique.
Figure 3E:
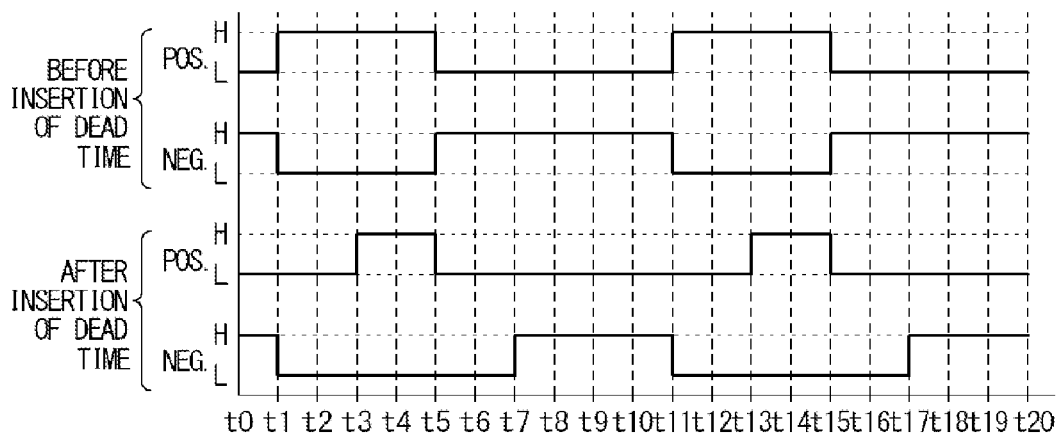
FIG. 3E shows the PWM output signal waveform of the saw-teeth waveform the PWM output apparatus of the related technique.
Figure 3F:
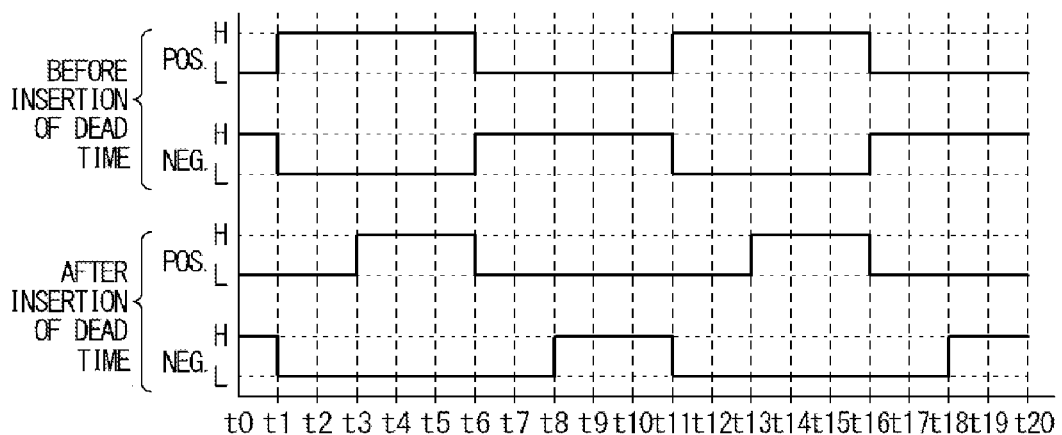
FIG. 3F show the PWM output signal waveform of the saw-teeth waveform the PWM output apparatus of the related technique.
Figure 4:
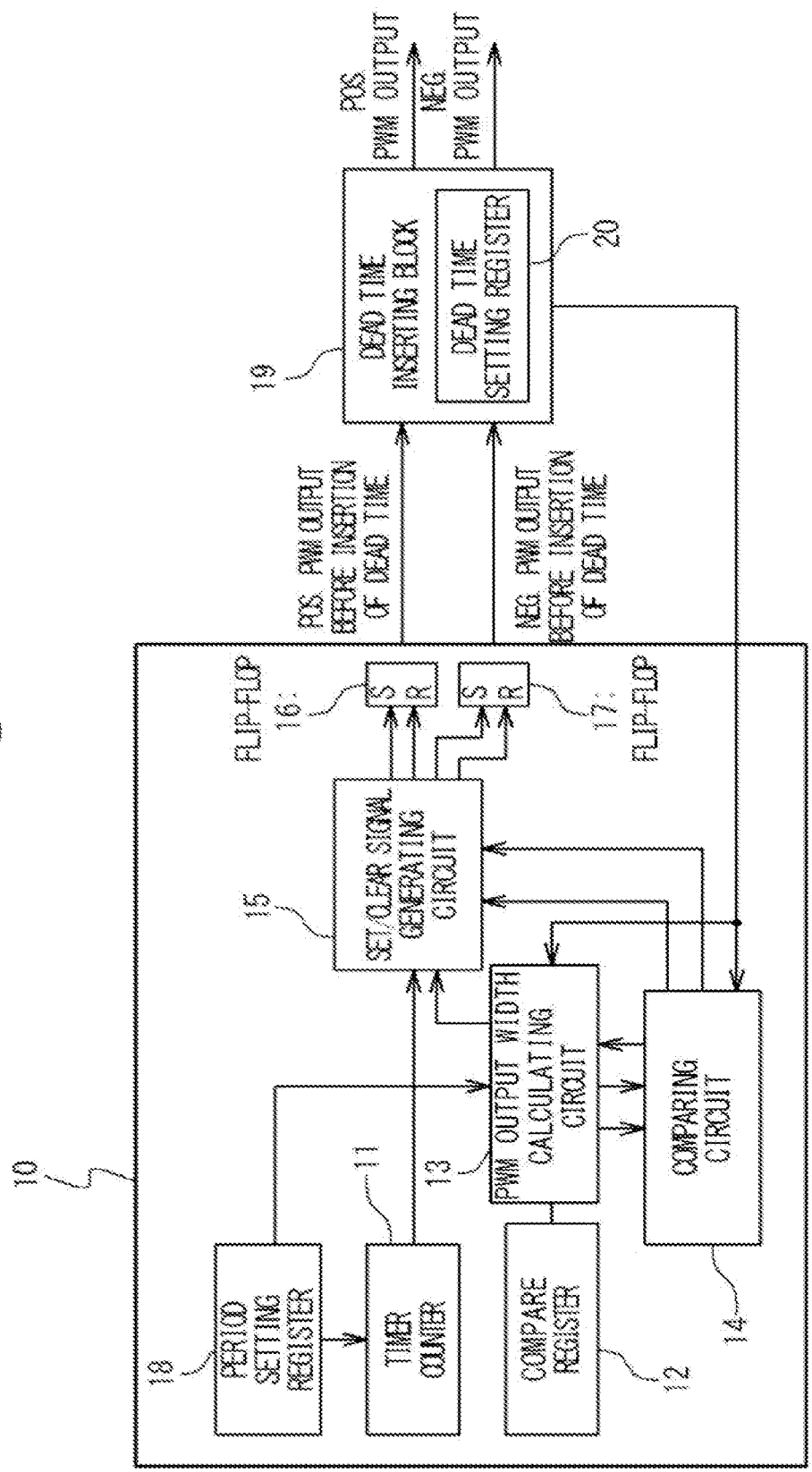
FIG. 4 is a circuit diagram of a saw-teeth waveform PWM output apparatus according to embodiments of the present invention.

Hereinafter, the first embodiment of the present invention will be described in detail. FIG. 4 is a block diagram showing the configuration of the PWM output apparatus for motor control according to the first embodiment of the present invention. The PWM output apparatus of the first embodiment is provided with a PWM signal generating block 10 and a dead time inserting block 19.

The PWM signal generating block 10 is provided with a timer counter 11, a compare register 12 for a PWM output signal, a PWM output width calculating circuit 13, a comparing circuit 14 of a PWM output width and a dead time period, a set/clear signal generating circuit 15, a flip-flop 16 for a positive phase PWM output signal, a flip-flop 17 for a negative phase PWM output signal, and a period setting register 18. The dead time inserting block 19 is provided with a dead time setting register 20.

The compare register 12 retains a setting value of the PWM output width before the dead time insertion. The setting value is outputted to the PWM output width calculating circuit 13. The setting value of the compare register 12 is set in advance in consideration of a desired situation of a motor control by a user of the apparatus. The period setting register 18 is a register in which the period of the timer counter is set. The setting value is outputted to the PWM output width calculating circuit 13 and the timer counter 11.

The timer counter 11 counts clocks for the period set in the period setting register 18. The count value is cleared to "0" when being equal to the period set in the period setting register 18, and is increased in response to the clock cycle otherwise. The current value of the timer counter 11 is outputted to the set/clear signal generating circuit 15.

The PWM output width calculating circuit 13 calculates the output width of a PWM output signal of a first signal and a second signal which are opposite in phase to each other, based on a command value of the PWM output signal. The first signal and the second signal correspond to an upper arm and a lower arm of an inverter circuit which drives a motor. The field current of the 3-phase motor is generated by the inverter circuit which is provided with three pairs of the upper arm and the lower arm, and the 3-phase motor is PWM-controlled. In the description of the present embodiment, the first signal is the positive phase signal and the second signal is the negative phase signal. However, the second signal may be the positive phase signal and the first signal may be the negative phase signal.

Moreover, a motor driving apparatus of the present embodiment is provided with the PWM output apparatus of the present embodiment, and an inverter circuit which is driven in accordance with a corrected command value (a command value which has been corrected by inserting the dead time in the PWM command value) outputted from the PWM output apparatus, and which PWM-controls the field current of the motor.

The PWM output width calculating circuit 13 outputs the setting value of the compare register 12 just as it is, to the comparing circuit 14 as an output width of the positive phase PWM output signal. In addition, the PWM output width calculating circuit 13 outputs a value obtained by subtracting the setting value of the compare register 12 from the setting value of the period setting register 18 to the comparing circuit as the output width of the negative phase PWM output signal. The output signal of the PWM output width calculating circuit 13 has a PWM output signal before the dead time insertion, in which the positive phase signal and the negative phase signal are perfectly opposite to each other in phase.

The PWM output width calculating circuit 13 further outputs one of the setting value of the compare register 12 and a value obtained by subtracting the setting value of the dead time setting register 20 from the setting value of the compare register 12 to the set/clear signal generating circuit 15 based on the comparison result of the comparing circuit 14. When the PWM output width is shorter than a predetermined dead time period, the setting value of the compare register 12 is outputted. When the PWM output width is equal to or longer than the predetermined dead time period, the value obtained by subtracting the setting value of the dead time setting register 20 from the setting value of the compare register 12 is outputted.

The dead time setting register 20 retains the setting value of the dead time period to be inserted in the PWM output signal. The output thereof is supplied to the comparing circuit 14 and the PWM output width calculating circuit 13.

A comparison result of the PWM output width and a predetermined value of the dead time period is outputted to the set/clear signal generating circuit 15 and the PWM output width calculating circuit 13 from the comparing circuit 14. The predetermined dead time period registered on the comparing circuit 14 in advance is a reference period for preventing the dead time from being inserted into the negative phase signal when a pulse width is small.

The reference period is set to a multiple of the clock period of the PWM output apparatus in the present embodiment. It is desirable that the reference period is set to the multiple of the dead time period, from the viewpoint of the responsibility of the PWM output signal to the command signal of the PWM control. Especially, it is desirable that the reference period is set to twice of the dead time period of the setting vale latched by the dead time setting register 20. When the dead time period is set to the dead time setting register 20, the comparing circuit 14 acquires the dead time period and registers a multiple of the dead time period by a predetermined number as the reference period.

The set/clear signal generating circuit 15 generates a set/clear signal based on a current value of the timer counter 11, the setting value of the compare register 12 and the comparison result of the comparing circuit 14. When the PWM output width of the PWM output signal before the dead time insertion is shorter than the reference period (predetermined dead time period registered on the comparing circuit), the clear signal is generated. Oppositely, when the PWM output width of the PWM output signal before the dead time insertion is equal to or longer than the reference period, the set signal is generated. The set/clear signal is outputted to the flip-flop 16 for the positive phase PWM output signal and the flip-flop 17 for the negative phase PWM output signal.

The Flip-flop 16 for the positive phase PWM output signal and the flip-flop 17 for the negative phase PWM output signal configure a PWM output signal generating circuit which supplies the PWM output signal before the dead time insertion to the dead time inserting block 19. When the set/clear signal generating circuit 15 outputs the set signal, the PWM output signal generating circuit relays the PWM output signal generated by the PWM output width calculating circuit 13 without transforming it, and transfers to the dead time inserting block 19 as a corrected PWM output signal. On the other hand, when the set/clear signal generating circuit 15 outputs the clear signal, the PWM output signal generating circuit carries out a correction so as to set the positive phase signal of the PWM output signal to the inactive condition, and relays the negative phase signal thereof without transforming it and outputs to the dead time inserting block 19 as the corrected PWM output signal.

The output of the flip-flop 16 for the positive phase PWM output signal and the output of the flip-flop 17 for the negative phase PWM output signal (PWM output signal before the dead time insertion) are supplied to a dead time inserting block 19. The dead time inserting block 19 inserts the dead time period based on the value of the dead time setting register 20 when a dead time insertion event (switching from the active condition to the inactive condition) occurs. As a result, the positive phase PWM output signal obtained by inserting the dead time period into the output of the flip-flop 16 for the positive phase PWM output signal and the negative phase PWM output signal obtained by inserting the dead time period into the output of the flip-flop 17 for the negative phase PWM output signal are generated.

Next, the circuit operation of the present embodiment will be described. The set/clear signal generating circuit 15 fixes the set signal of the flip-flop 16 for the positive phase PWM output signal or the set signal of the flip-flop 17 for the negative phase PWM output signal to "0" in response to a control signal outputted from the comparing circuit 14. By this setting, the PWM output signal before the dead time insertion is fixed to "0".

FIG. 5A to FIG. 5F are the PWM output signals of the saw-teeth waveform PWM output apparatus of the present invention. In an example of the diagrams, 2 clock cycles are set to the dead time setting register 20 as the dead time period. Also, five kinds of clock cycle of the PWM output width of "0" clock cycle, "1" clock cycle, "2" clock cycles, "3" clock cycles, and "4" clock cycles are set to the compare register 12.

Figure 5A:
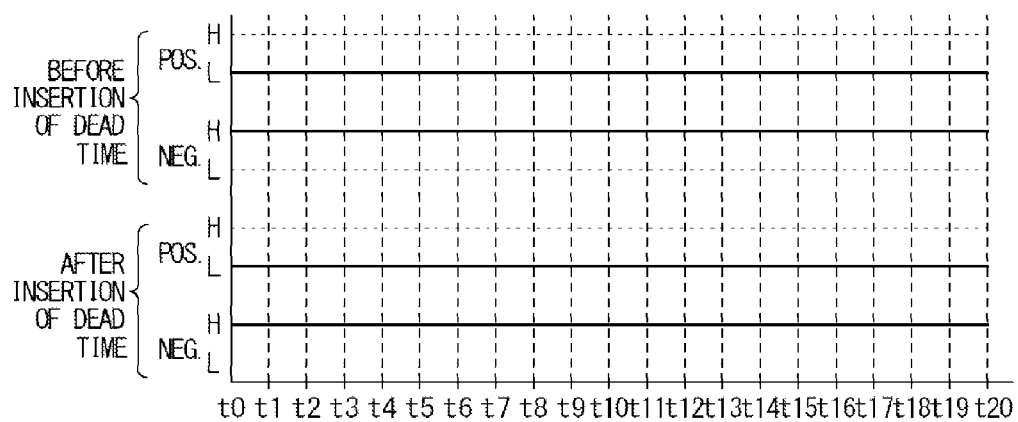
FIG. 5A shows an output waveform of the saw-teeth waveform PWM output apparatus in the first embodiment.

FIG. 5A shows the PWM output signal when the PWM output width of "0" clock cycle is set to the compare register 12. In FIG. 5A, in the PWM output signal outputted from the PWM signal generating block 10, the positive phase signal is fixed to the inactive condition and the negative phase signal is fixed to the active condition. Both of the positive phase signal and the negative phase signal never change to the inactive condition from the active condition. Therefore, in the PWM output signal after the dead time insertion, the positive phase PWM output signal is fixed to the inactive condition and the negative phase PWM output signal is fixed to the active condition.

Figure 5B:
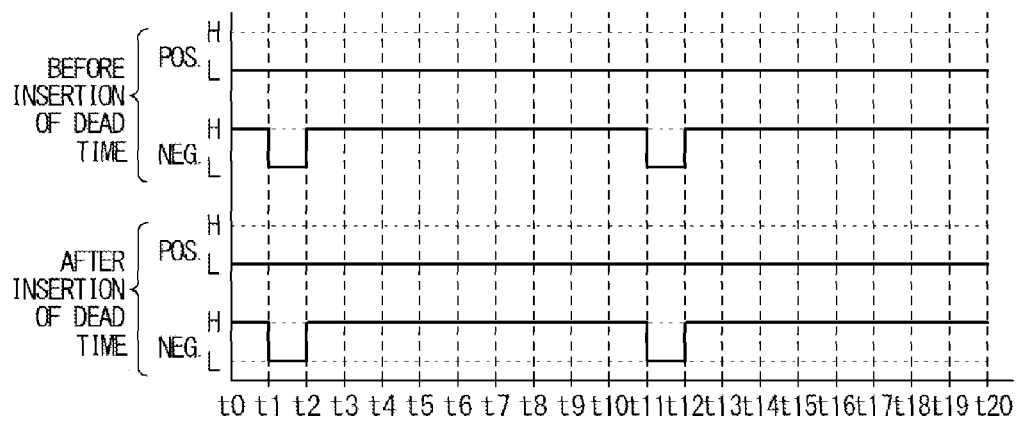
FIG. 5B shows the output waveform of the saw-teeth waveform PWM output apparatus in a first embodiment.

FIG. 5B shows a PWM output signal when the PWM output width of 1 clock cycle is set to the compare register 12. In FIG. 5B, because in the PWM output signal outputted from the PWM signal generating block 10, the PWM output width for the positive phase signal is shorter than twice of 2 clock cycles set to the dead time setting register 20, the set signal for the positive phase signal is masked. As a result, the positive phase PWM output signal is fixed to the inactive condition, and the negative phase PWM output signal is set to the inactive condition during the 1 clock cycle. The positive phase PWM output signal after the dead time insertion is fixed to the inactive condition. In the dead time insertion processing into the negative phase PWM output signal, because the positive phase PWM output signal before the dead time insertion is fixed to the inactive condition, the dead time is not inserted. As a result, the negative phase PWM output signal is set to the inactive condition during the 1 clock cycle.

Figure 5C:
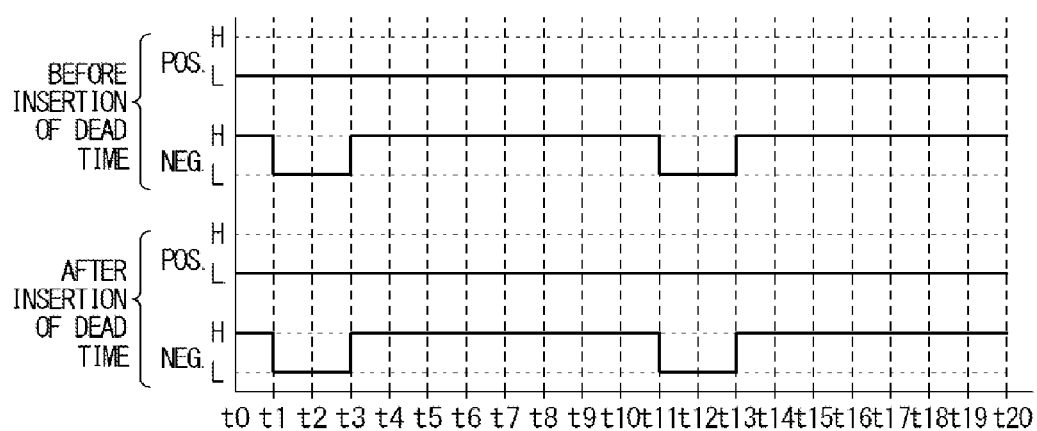
FIG. 5C shows an output waveform of the saw-teeth waveform PWM output apparatus in the first embodiment.

FIG. 5C shows the PWM output signal when the PWM output width of 2 clock cycles is set to the compare register 12. In FIG. 5C, in the PWM output signal outputted from the PWM signal generating block 10, because the PWM output width for the positive phase signal is shorter than twice of the 2 clock cycles set to the dead time setting register 20, the set signal for the positive phase signal is masked and the positive phase PWM output signal is fixed to the inactive condition. As a result, the negative phase PWM output signal is set to the inactive condition during the 2 clock cycles. Regarding the PWM output signal after the dead time insertion, the positive phase PWM output signal is fixed to the inactive condition. In case of the dead time insertion processing to the negative phase PWM output signal, because the positive phase PWM output signal before the dead time insertion is fixed to the inactive condition, the dead time is not inserted. As a result, the negative phase PWM output signal is set to the inactive condition during the 2 clock cycles.

Figure 5D:
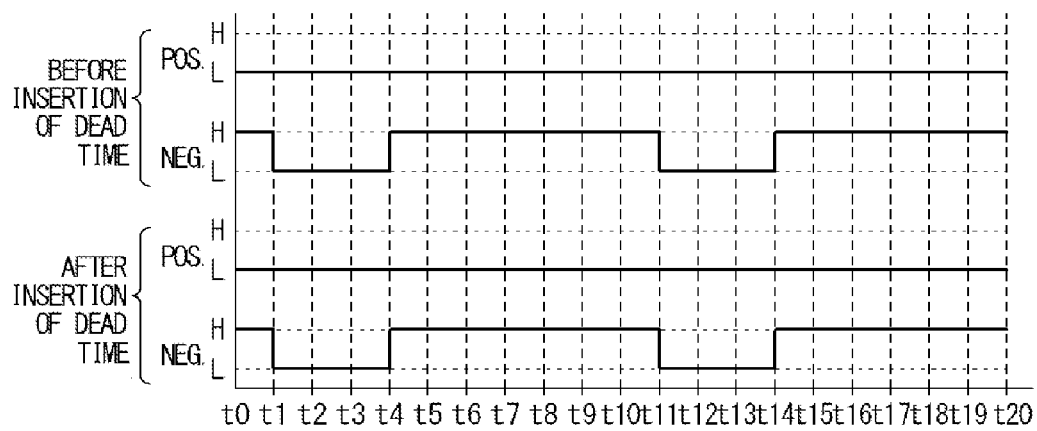
FIG. 5D shows the output waveform of the saw-teeth waveform PWM output apparatus in the first embodiment.

FIG. 5D shows the PWM output signal when the PWM output width of 3 clock cycles is set to the compare register 12. In FIG. 5D, in the PWM output signal outputted from the PWM signal generating block 10, the PWM output width for the positive phase signal is shorter than twice of the 2 clock cycles set to the dead time setting register 20. Therefore, the set signal for the positive phase signal is masked. As a result, the positive phase PWM output signal is fixed to the inactive condition and the negative phase PWM output signal is set to the inactive condition during the 3 clock cycles. Regarding the PWM output signal after the dead time insertion, the positive phase PWM output signal is fixed to the inactive condition. In case of the dead time insertion processing into the negative phase PWM output signal, because the positive phase PWM output signal before the dead time insertion is fixed to the inactive condition, the dead time is not inserted. As a result, the negative phase PWM output signal is set to the inactive condition during the 3 clock cycles.

Figure 5E:
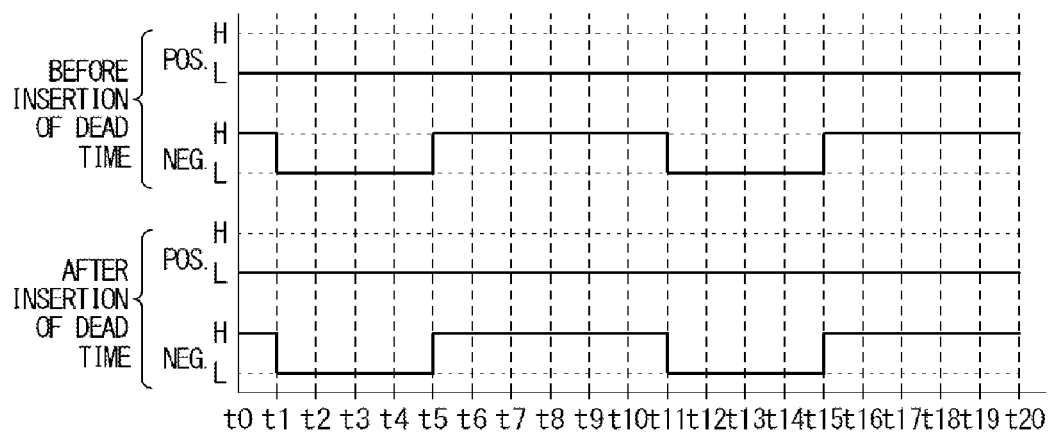
FIG. 5E shows the output waveform of the saw-teeth waveform PWM output apparatus in the first embodiment.

FIG. 5E shows the waveform of the PWM output signal when the PWM output width of 4 clock cycles is set to the compare register 12. In FIG. 5E, in the PWM output signal outputted from the PWM signal generating block 10, because the PWM output width for the positive phase signal is equal to twice of the 2 clock cycles set to the dead time setting register 20, the set signal for the positive phase signal is masked, and the positive phase PWM output signal is fixed to the inactive condition. The negative phase PWM output signal is set to the inactive condition during the 4 clock cycles. Regarding the PWM output signal after the dead time insertion, the positive phase PWM output signal is fixed to the inactive condition. In case of the dead time insertion processing into the negative phase PWM output signal, because the positive phase PWM output signal before the dead time insertion is fixed to the inactive condition, the dead time is not inserted. As a result, the negative phase PWM output signal is set to the inactive condition during the 4 clock cycles.

Figure 5F:
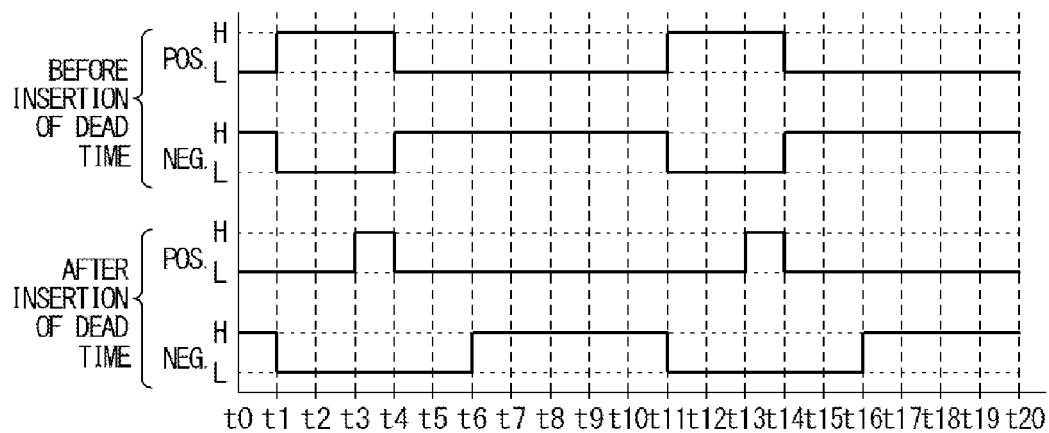
FIG. 5F shows the output waveform of the saw-teeth waveform PWM output apparatus in the first embodiment.

FIG. 5F shows the PWM output signal when the PWM output width of 5 clock cycles is set to the compare register 12. In FIG. 5F, in the PWM output signal outputted from the PWM signal generating block 10, the PWM output width for the positive phase signal is longer than twice of the 2 clock cycles set to the dead time setting register 20. Therefore, the set/clear signal generating circuit 15 outputs the set signal. In this case, the PWM output width calculating circuit 13 calculates a value (the PWM output width of 3 clock cycles) by subtracting the value set to the dead time setting register 20 from the value of the PWM output width set to the compare register 12, and outputs the positive phase and negative phase PWM output signals which have the pulse width of the subtraction result to the set/clear signal generating circuit 15.

In an upper drawing of FIG. 5F, in the operation to FIG. 5E, the positive phase set signal which has been masked in the operations of FIG. 5A to FIG. 5E, is used as it is, and the PWM output width for the positive phase signal is set to the active condition during the 3 clock cycles. The negative phase PWM output signal is set to the inactive condition during the 3 clock cycles. When the dead time insertion processing is carried out, the positive phase PWM output signal is set to the active condition during 1 clock cycle. Because the dead time is inserted, the negative phase PWM output signal is set to the inactive condition during the 5 clock cycles.

The above-mentioned PWM output apparatus of the first embodiment has the following features. In the condition of FIG. 5A, the positive phase and negative phase PWM output signals after the dead time insertion are fixed to the active condition and the inactive condition, respectively. In FIG. 5B to FIG. 5F, the negative phase PWM output signal is controlled in the 1 clock cycle width sequentially. On the other hand, the positive phase PWM output signal is fixed to the active condition until the negative phase PWM output signal is set to the active condition during the 4 clock cycles (FIG. 5E). Moreover, the positive phase PWM output signal is set to the active condition during the 1 clock cycle at the time when the negative phase PWM output signal is set to the active condition during the 5 clock cycles (FIG. 5F). Since then, the positive phase PWM output signal is controlled in the 1 clock cycle width sequentially.

In the present embodiment, a control is started from the condition that the positive phase PWM output signal is fixed to the active condition and the negative phase PWM output signal is fixed to the inactive condition. When the PWM output signal is changed gradually, the PWM output width can be adjusted in the 1 clock cycle width. Therefore, high precision can be attained in the motor control in a region of a small duty ratio.

The characteristic signal processing in the present embodiment is carried out in the PWM signal generating block 10. Because the dead time inserting block carries out the processing of inserting the dead time independently to the PWM output signal from the PWM signal generating block 10, for example, the dead time can be surely inserted by the method shown in the related technique. Therefore, the safety of the apparatus such as a motor is secured.

When the PWM output width before the dead time insertion and twice of the dead time period are compared and the output width of the positive phase PWM output signal before the dead time insertion is equal to or less than twice of the dead time period, the positive phase PWM output signal outputted to the dead time inserting block is set to the inactive fixation. In this state, the insertion of the dead time into the negative phase PWM output signal does not occur. The negative phase PWM output signal can be controlled in the 1 clock cycle width sequentially.

In the same way, when the negative phase PWM output signal is less than twice of the dead time setting value, the negative phase PWM output signal outputted to the dead time inserting block is set to the inactive fixation. In this condition, the insertion of the dead time into the positive phase PWM output signal does not occur. Therefore, the positive phase PWM output signal can be controlled in the 1 clock cycle width sequentially.

What is claimed is:

1. A PWM signal generating method comprising:
    comparing, by a comparing circuit, a value indicative of a pulse width of a PWM signal and a value indicative of a reference dead time period;
    generating a resultant signal based on the comparison;
    generating, by a PWM output circuit, a PWM output signal including a first voltage signal and a second voltage signal based on the pulse width value, a value indicative of a dead time period, the resultant signal, and a clock value of a clock period;
    setting, by a dead time setting circuit, a signal indicative of the dead time period into the PWM output signal in response to a setting event of the first and second voltage signals; and
    generating, by the PWM output circuit, a target PWM output signal based on the setting of the signal, wherein said generating of the PWM output signal comprises:
    simultaneously generating the first and second voltage signals, the first voltage signal being set to an inactive level when the resultant signal indicates that the pulse width value is equal to or smaller than the reference dead time period value, and the second voltage signal being set to an inactive level for a period of time which equals the pulse width value; and
    simultaneously generating the first and second voltage signals, the first voltage signal being set to an active level for a period of time which equals the difference between the pulse width value and the dead time period value when the resultant signal indicates that the pulse width value is greater than the reference dead time period value, and the second voltage signal being set to an inactive level for a period of time which equals the difference between the pulse width value and the dead time period value, and
    wherein the setting of the signal indicative of the dead time period comprises:
        setting the dead time signal into the first voltage signal at a transition of the first voltage signal from an inactive to an active level in response to the setting event; and
        setting the dead time signal into the second voltage signal at a transition of the second voltage signal from an inactive to an active level in response to the setting event.

2. The PWM signal generating method according to claim 1,
    wherein the reference dead time period is an integral multiple of the dead time period.

3. The PWM signal generating method according to claim 1,
    wherein the reference dead time period is twice the dead time period.

4. The PWM signal generating method according to claim 1,
    wherein the setting of the signal indicative of the dead time period further comprises:
        stopping the generation of the setting event with respect to the first and second voltage signals, when the first voltage signal is set to the inactive level.

5. The PWM signal generating method according to claim 1, further comprising:
    setting the pulse width value and the dead time period value.

6. A PWM signal generating method comprising:
    calculating, by a calculating circuit, an output width of a PWM output signal based on a command value of a PWM output, the PWM output signal including a first signal and a second signal, the first and second signals having phases different from each other;
    setting, by a dead time setting circuit, a signal indicative of a dead time period into the PWM output signal in response to a setting event of the first and second signals;
    comparing, by a comparing circuit, the output width and a reference period which is set longer than a predetermined dead time period; and
    outputting, by a PWM output circuit, the PWM output signal as a corrected PWM output signal when the output width is shorter than the reference period.

7. The PWM signal generating method according to claim 6, further comprising:
    carrying out a correction by setting the first signal to be inactive when the output width is longer than the reference period.

8. The PWM signal generating method according to claim 6, further comprising:
    correcting the corrected PWM output signal such that the second signal is turned off during the dead time period after the first signal is turned on, thereby obtaining a corrected command value.

* * * * *